United States Patent [19]

Gruner et al.

[11] 4,358,748
[45] Nov. 9, 1982

[54] THIN FILM CIRCUIT

[75] Inventors: Heiko Gruner; Georg Zimmermann, both of Gerlingen, Fed. Rep. of Germany

[73] Assignee: Robert Bosch GmbH, Stuttgart, Fed. Rep. of Germany

[21] Appl. No.: 117,452

[22] Filed: Feb. 1, 1980

[30] Foreign Application Priority Data

Feb. 22, 1979 [DE] Fed. Rep. of Germany ....... 2906813

[51] Int. Cl.³ .................... H01L 49/02; H01C 17/12
[52] U.S. Cl. ........................................ 338/25; 29/620;
29/621; 156/650; 156/656; 156/659.1; 338/308;
338/309; 338/320; 427/103; 428/209; 430/312;
430/316; 430/319
[58] Field of Search ....... 204/192 F, 192 SP, 192 EC,
204/38 A, 38 B; 338/308, 309, 25; 427/88, 89,
101, 103; 428/209, 210; 156/650, 652, 656,
659.1, 661.1; 430/312, 316, 318, 319; 29/620,
621

[56] References Cited

U.S. PATENT DOCUMENTS

| 3,256,588 | 6/1966 | Sikina et al. | 29/620 |
| 3,544,287 | 12/1970 | Sharp | 29/620 |
| 3,621,442 | 11/1971 | Racht | 338/309 |
| 4,107,632 | 8/1978 | Dawson | 333/81 A |
| 4,199,745 | 4/1980 | Barry | 338/320 |

FOREIGN PATENT DOCUMENTS 2657949  6/1978  Fed. Rep. of Germany ... 204/192 F

Primary Examiner—Delbert E. Gantz
Assistant Examiner—William Leader
Attorney, Agent, or Firm—Frishauf, Holtz, Goodman & Woodward

[57]  ABSTRACT

To improve the adhesion of a nickel layer to a valve metal layer in a thin film electronic circuit, a boundary layer is created between the valve metal and the nickel layer. The boundary layer is created by oxidizing the valve metal surface and applying the nickel layer by cathode sputtering with sufficiently high energy to cause nickel-ion migration into the valve metal oxide layer. The so-formed boundary layer improves the mechanical adhesion of the nickel layer to the valve metal layer and also prevents penetration of solder to the valve metal layer since the boundary layer acts as a diffusion barrier.

22 Claims, 19 Drawing Figures

THIN FILM CIRCUIT

Cross-reference to related applications and publications:

U.S. Pat. No. 3,256,588

The present invention relates to thin film circuits and their manufacture.

BACKGROUND AND PRIOR ART

U.S. Pat. No. 3,256,588 discloses an electronic thin film circuit in which a nickel layer is directly applied to the valve metal layer in the region of the first pattern for forming the conductive strips and/or terminals. In this thin film circuit, it is difficult to deposit the nickel layer in such a way that it adheres well to the valve metal layer. If a lead is to be soldered to the nickel layer, and the soldering time is fairly long, it is possible that the nickel layer will dissolve in the applied solder to such an extent that it no longer adheres to the valve metal layer.

THE INVENTION

It is an object of the present invention to furnish a thin film circuit and a method for manufacturing same in which the nickel layer adheres well to the valve metal layer, even if it is subjected to extended soldering times.

In accordance with the present invention, a boundary layer is created between the nickel layer and the valve metal layer at least in the region of the pattern constituting electrical connecting means, such as a terminal or conductive strips interconnecting the various components. The boundary layer comprises the valve metal, a valve metal oxide, nickel, nickel oxide and intermetallic compounds of these components. Solder applied on the nickel layer, even if the whole nickel layer is covered by such solder, can no longer penetrate to the valve metal layer, since the boundary layer acts as a diffusion barrier.

DRAWINGS ILLUSTRATING A PREFERRED EMBODIMENT

and FIGS. 4a through 4d illustrate the development of a boundary layer and its effect as a barrier to solder.

Figure 1:
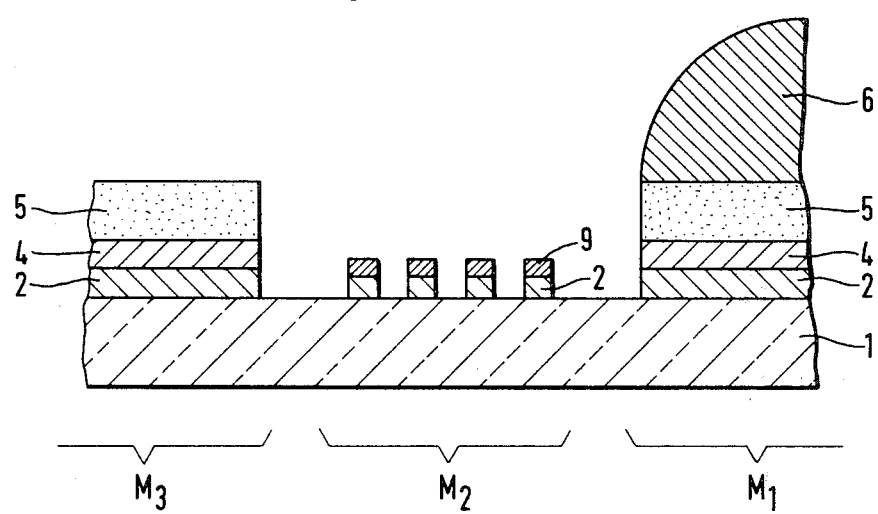
FIG. 1 is a partially sectional view of a thin film circuit of the present invention including a temperature dependent and a temperature independent resistor.

The insulating substrate 1 of FIG. 1 may be made of, for example, soft glass or $Al_2O_3$-ceramic or may be constituted by a metal plate with an insulating layer, for example spring steel or ferrite. A tantalum layer 2 on substrate 1 contains the basic geometric pattern of the circuit. Alternatively, layer 2 can be made of tantalum nitride or tantalum oxinitride ($TaO_xN_y$) or a tantalum aluminum alloy. Instead of tantalum, another valve metal, for example niobium, aluminum, zirconium or hafnium may be used as the main constituent.

The tantalum layer 2 forms a first, second and third pattern of the electronic thin film circuit, the first pattern $M_1$ constituting a conductive strip and/or a terminal, the second pattern $M_2$ constituting a resistor whose resistance is independent of temperature, while the third pattern $M_3$ defines a temperature dependent resistor.

In the region of pattern $M_1$, tantalum layer 2 is covered by a boundary layer 4 which consists of tantalum, tantalum oxide, nickel, nickel oxide and compounds and/or mixtures thereof. A nickel layer 5 and, on the nickel layer 5, a solder layer 6 are arranged on boundary layer 4 in the region of pattern $M_1$. The solder layer 6 may, for example, be made of lead-tin solder. Layers 2, 4, 5 and 6 form a conductive strip and/or the terminal in the region of the first pattern $M_1$. Solder layer 6 may, if appropriate, be dispensed with or an electroplated reinforcement layer may be substituted therefor.

In the region of pattern $M_2$, the tantalum layer 2 constitutes the temperature independent resistor and is covered by a layer 9 of tantalum oxide.

In the region of pattern $M_3$, the tantalum layer 2 is covered with the boundary layer 4 and the boundary layer 4 with a nickel layer 5 as was the case in the first pattern $M_1$. In the region of pattern $M_3$, however, layers 2, 4 and 5 form a temperature dependent resistor (sensor).

In the region of pattern $M_2$, the tantalum oxide layer 9 can be replaced by a layer 30 (see also FIG. 2i and FIG. 3) whose manufacture and composition will be described further below.

Figure 2A:
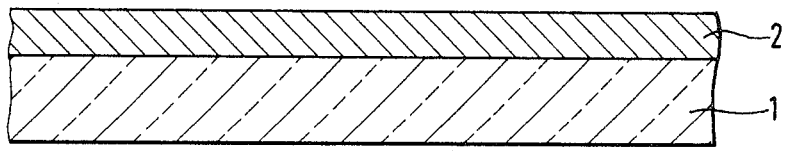
FIGS. 2a through 2n show a thin film circuit according to the present invention at different stages of the manufacturing process according to the present invention.
Figure 2B:
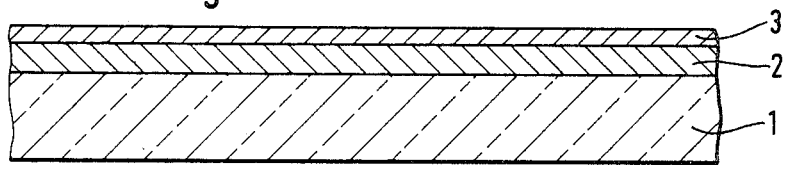
Figure 2C:
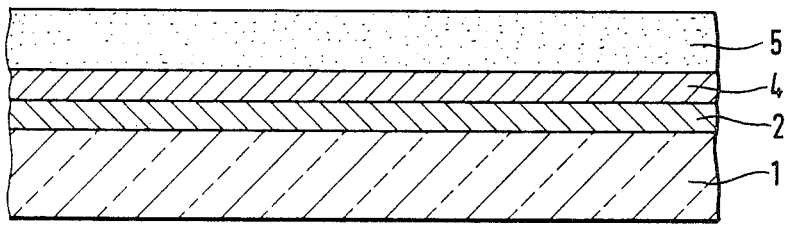
Figure 2D:
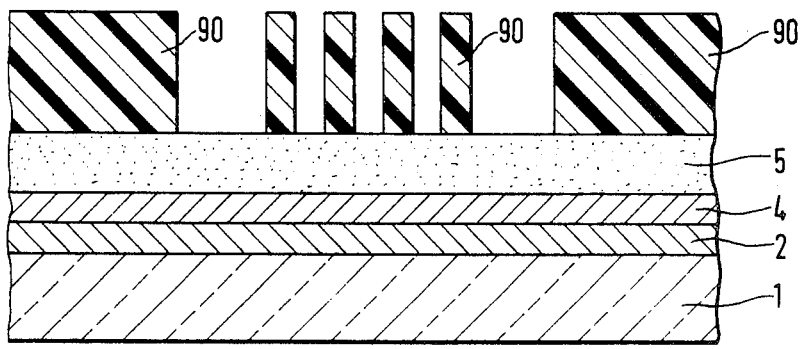
Figure 2E:
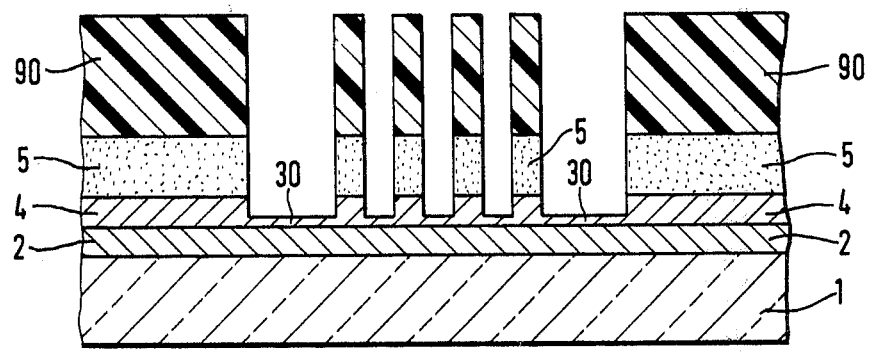
Figure 2F:
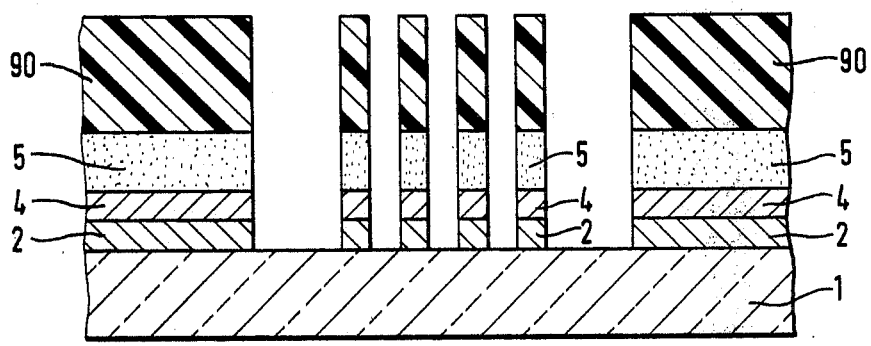
Figure 2G:
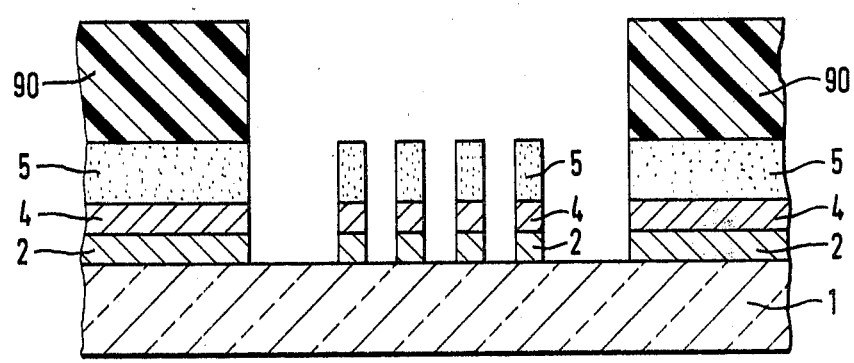
Figure 2H:
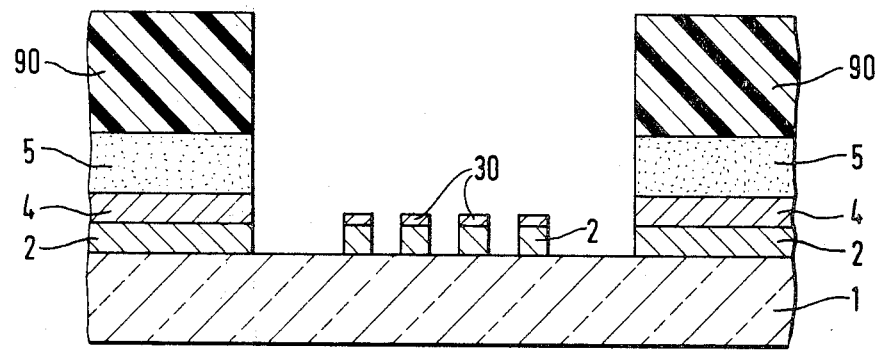
Figure 2I:
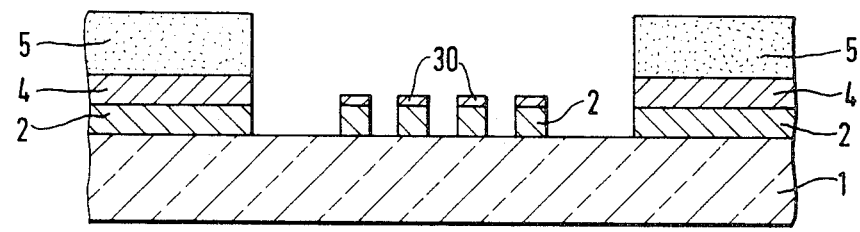
Figure 2K:
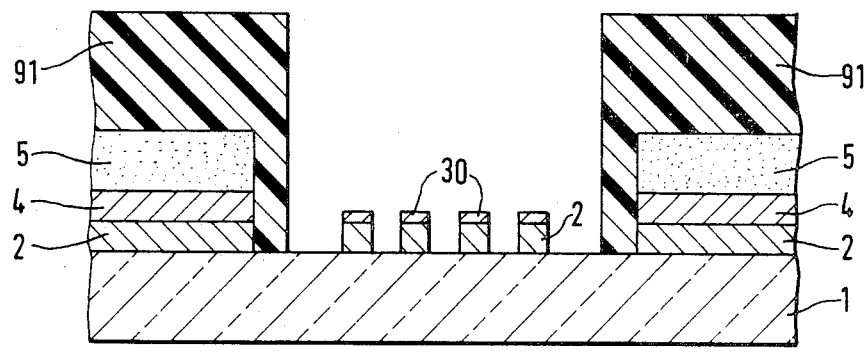
Figure 2L:
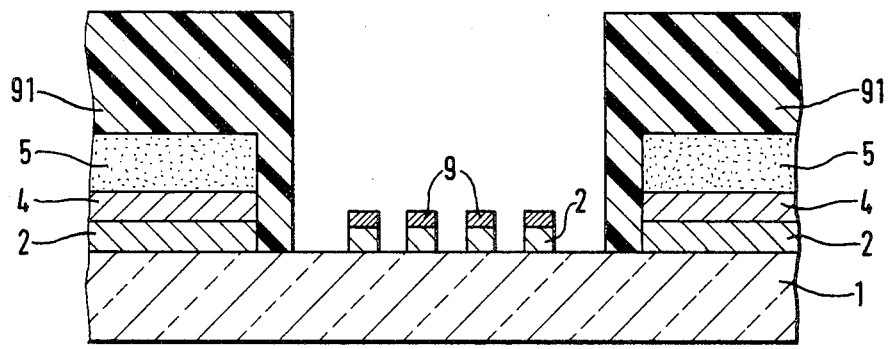
Figure 2M:
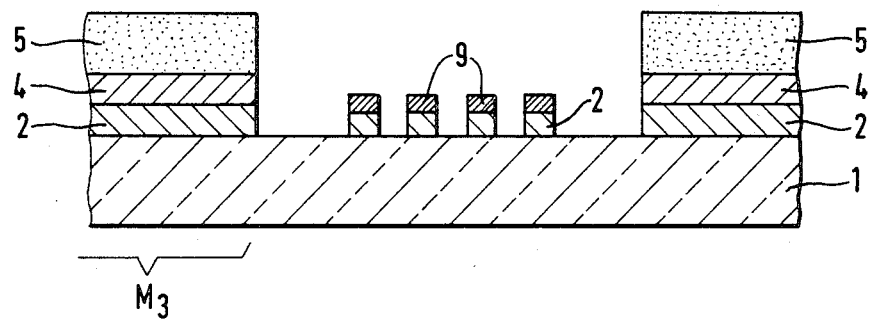
Figure 2N:
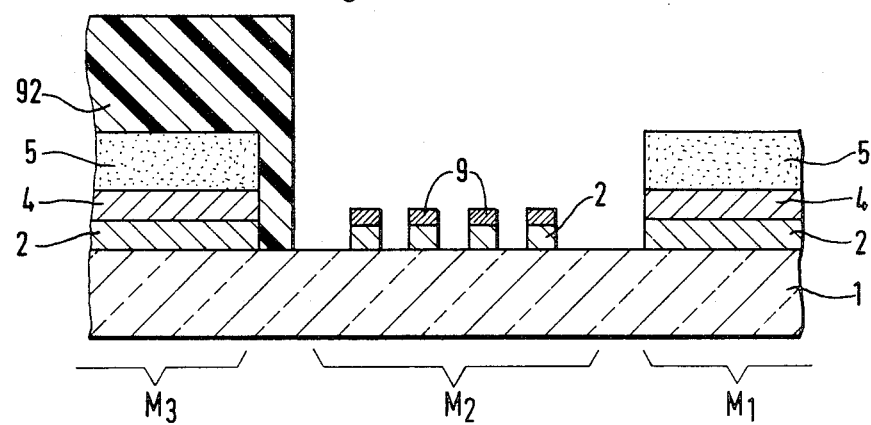

FIGS. 2a through 2n show an electronic thin film circuit as shown in FIG. 1 during manufacture and, in particular, illustrate the specific steps in the method of the present invention.

A tantalum layer 3 is first applied to insulating substrate 1 by means of cathode sputtering (FIG. 2a). Its thickness is a function of the two purposes which this tantalum layer serves. First, the layer is to assure good adherence between substrate 1 and the layers deposited thereon. Secondly, in the region of pattern $M_2$, the tantalum layer is to be formed into anodically trimmable resistors of long time stability whose resistances are substantially independent of temperature, (i.e. a temperature coefficient of less than 100 ppm/°C.), and whose relative resistance change resulting from mechanical deformation is approximately double that of the elongation resulting from the deformation. In order to fulfill both of these tasks, this tantalum layer 2 should have a square resistance of between 20 and 200 ohms and, preferably, of 50 ohms.

In order to form the tantalum oxide layer 3 (FIG. 2b), tantalum layer 2 is first oxidized at its free surface, preferably in a wash and dry process in which all foreign particles which might lead to defects are removed. The thickness of the tantalum oxide layer 3 is adjusted to be between 3 and 10 nm by adjustment of the temperature and the length of drying time. A preferred thickness is 5 nm. In any case, the thickness of this layer exceeds the tantalum surface oxide layer which would form naturally during long-term storage of the wafer. Oxide layer 3 could also be produced by other methods, for example by anodic oxidation, the desired thickness being obtained by adjustment of the balancing parameters.

In a second sputter process, the whole surface of continuous oxide layer 3 which covers tantalum layer 2 is covered with a nickel layer 5. The sputter energy is selected to be sufficiently high that, first, tantalum layer 2 is pre-aged because of the thermal load with resultant long-term stability and, secondly, a diffusion of nickel atoms into tantalum oxide layer 3 takes place, thereby creating boundary layer 4 (FIG. 2c) by means of reduction and oxidation processes. Boundary layer 4 contains tantalum, tantalum oxide, nickel, nickel oxide and mixed phases of these constituents. Boundary layer 4 not only mechanically anchors nickel layer 5 on tantalum layer 2, but also provides a very good electrical contact between the two layers.

If the nickel layer can be deposited without interruption of the vacuum immediately after the depositing of the tantalum layer the necessary surface oxidation of the tantalum layer may be accomplished in a delayed cooling phase by reaction with the residual oxidation gas. If, for other reasons, the energy during nickel deposition must be held so low that only insufficient nickel diffusion into the tantalum oxide layer takes place, the diffusion process and the aging of the tantalum layer can take place in a subsequent tempering process.

Nickel layer 5 fulfills the following purposes:

First in the region of pattern $M_3$ (see FIG. 1), the nickel layer constitutes a temperature sensitive resistance layer whose electrical resistance varies substantially linearly as a function of temperature. The layer is thus a temperature sensor. Since the thermal coefficient of the layer increases with increasing thickness, while the resistance value is inversely proportional to thickness for a given geometric configuration and a fixed length-to-width ratio of the individual resistance elements, the required thickness of nickel layer 5 is determined by the resistance and temperature coefficient values for the temperature sensor. The square resistance will lie between 0.1 and 5 ohms, and will preferably be 0.5 ohms.

Secondly, in the region of pattern $M_1$ or parts thereof, nickel layer 5 may constitute the basis for galvanic plating process so that active building elements, such as chip transistors may be connected to the thin film circuit. To assure good plated metal layer with uniform thickness, the square resistance of the nickel layer should be less than 5 ohms and should, preferably, be 0.5 ohms.

Thirdly, in the region of pattern $M_1$ (see FIG. 1) or in parts thereof (see FIG. 3) nickel layer 5 may cooperate with lead-tin solder layer 6, which is required to achieve sufficient conductivity and which extends over all conductive strips, connecting points and terminals, i.e. which constitutes the main part of pattern $M_1$. It is particularly important for the present invention that the thickness of nickel layer 5 need not be matched to the soldering process but may be optimized with respect to the two other requirements mentioned above without decreasing the excellent soldering stability of the system. This is due to boundary layer 4, only a small part of which (8, FIG. 4d) is soluble in the lead-tin solder. When, because of a long soldering time at high soldering temperatures, all of nickel layer 5 is dissolved in the solder (7, FIG. 4d) as might be the case during repair, boundary layer 4 keeps the solder from coming into contact with tantalum layer 2 and from contracting and forming small drops. At the same time, the good adherence between the solder layer and the elements and leads soldered thereto remains high so that even in the case where the solder has progressed up to boundary layer 4 the strength of the arrangement is limited only by the resistance to rupture of the substrate material or of the solder itself.

The depositing of nickel layer 5 preferably takes place with hydrogen doping of the discharge gases, so that the temperature coefficient of the nickel layer is increased and also because under these conditions the application of solder is unexpectedly facilitated to the extent that soldering may take place without protective gilding and without activation of the surface by either slight etching or the use of flux.

The required circuit geometry is then etched as follows (FIG. 2d to FIG. 2f):

A photosensitive resist mask 90 covers all regions except those in which the surface of substrate 1 is to be re-exposed. To compensate for the tantalum undercut beneath the edge of the mask, all thin photoresist strips must be broadened by approximately 2 μm.

The etching takes place as a two-step process.

In the first step (FIG. 2e) nickel layer 5 and most of boundary layer 4 are etched selectively without undercutting away from tantalum layer 2 in a mixture of 190 g/l $(NH_4)_2S_2O_8$ with 460 g/l $H_2SO_4$, a small part 30 (FIG. 2e) of boundary layer 4 remaining.

In the second step (FIG. 2f) following a wash, the remainders of boundary layer 4 and tantalum layer 2 are removed by etching in a mixture of 190 g/l $(NH_4)_2S_2O_8$ with 125 g/l HF, which does not attack nickel. Nickel layer 5 thus constitutes a mask for tantalum layer 2, thereby limiting the undercutting of the tantalum layer relative to the mask to 1 μm.

For exposing the tantalum resistors (FIG. 2g to FIG. 2i) the following procedure takes place:

Because the accuracy of the nickel etching process is unexpectedly high, it is not necessary to remove the first mask and substitute a second photoresist mask by a second resist depositing, exposing-and-development process, to cover all nickel edges and surfaces at which no selective nickel etching is to take place. The first photoresist mask 90, which has been removed by a second exposure and development at the places indicated by $M_2$ in FIG. 1, namely the places where the tantalum layer 2 is to be exposed, suffices for carrying out the second selective nickel etching process by means of the above-mentioned etching solutions. If the nickel etching process takes place with the above-described etching means, no undercutting under the edge of the mask takes place even during the long etching processes which may be required to expose the tantalum resistance surfaces. Even when the etching is carried out over a period of time which is 10 times as long as the normal etching time, the undercutting is limited to 4 μm. After surface etching, a nickel-passivation layer forms unexpectedly at the nickel-resist edge, which prevents such undercutting.

For trimming the tantalum resistors by anodic oxidation in the region of the second pattern $M_2$, a trimming mask 91 (FIG. 2k) must first be manufactured. The procedure is as follows:

After removal of mask 90 of FIG. 2i, which was used for the etching process, all moisture must be removed from the surface before application of the second mask, since otherwise adherence problems may occur. For this purpose, the etched wafers are dried in an oven at at least 120° C. for approximately 30 minutes. Because nickel layer 5 is very stable with respect to corrosion, this treatment has no negative effects on the wetability of the solder, but results in excellent adherence of the new mask to the exposed surface of the substrate. Trimming mask 91 is then produced by the usual depositing, exposure and development process, the thickness of the resist layer being determined in dependence upon the required breakdown strength.

The pattern of trimming mask 91 must meet the following requirements:

1. In order to shield all nickel etching edges from attack by the electrolyte, the trimming window in trimming mask 91 must be smaller than that of etching mask 90. How much smaller it must be depends upon the precision of the exposure apparatus, so that the trimming mask 90 may be placed with sufficient accuracy of the etched structure without requiring a great deal of adjustment. The long-term stability of the resistors is not affected to any considerable extent by the fact that a small untrimmed portion remains at the end of each resistor. These portions of the resistance strips are sufficiently protected by the part 30 of boundary layer 4 which is not removed during the selected nickel etching process.

2. The dimensions of the trimming window can be so chosen, that trimming errors resulting from uneven current distribution in, for example, resistors tied down at one end are compensated. The compensation is effected by allowing different percentages of the surfaces of individual resistors to be exposed to the anodization process, and/or by exposing additional contact points.

Since the portion 30 of boundary layer 4 which was not removed by the selective nickel etching process is still present at the top surface of all exposed tantalum resistors, the electrolyte and the trimming procedure chosen for the anodic oxidation process must be such that this layer, which contains nickel oxide as the main ingredient to be considered, dissolves as rapidly as possible in the electrolyte and therefore does not interfere with the trimming process. For electrolytes containing $Na_2SO_4$ and/or $NH_4Cl$ this is the case when a constant voltage between 1 and 10 volts exceeding the electrolytic solution potential of nickel and of oxidic Ta-Ni compounds or mixtures in the selected electrolyte is first applied to all resistors. This voltage is 3 volts for 0.5 molar $Na_2SO_4$. The process is carried out with particular speed if the generator applying the voltage has a high current capacity, so that the charge required for the dissolution process flows without hindrance. At the same time, all nickel layer residues left behind during the selective nickel etching process are stripped from the resistance strips.

If constant current sources are available for the trimming process, then a high current is first selected so that the dissolution process will be hastened. This high current is maintained until a noticeable resistance trim has been achieved, for example until the resistance has been increased by 10%. For the remaining trimming operation, current density must be so low that all resistors of the circuit are within their required tolerance values following the trimming process, the resistance tolerances being selected to fit the particular circuit requirements.

After the resistance trimming by anodic oxidation, the tantalum layer 2 in the region of the second pattern $M_2$ is covered with a tantalum oxide layer 9 (FIG. 2*l*).

Trimming mask 91 is now removed (FIGS. 2*m*) and, subsequently, a mask 92 made of solder blocking material is deposited on nickel layer 5 in the region of pattern $M_3$ (FIG. 2*n*).

The device shown in FIG. 2*n* is now dipped into liquid lead-tin soft solder. The liquid solder doesn't wet the resistance strips 2 which are covered with valve metal oxide layer 9 (pattern $M_2$), and the resistance strips 2, 4, and 5 which are covered by mask 92 (pattern $M_3$). The exposed top surface of metallization 2, 4, and 5 in pattern $M_1$ is, however, wetted by the liquid solder, causing a solder layer 6 to be formed. Thus, after removal of mask 92, the device shown in FIG. 1 has been formed, which constitutes the finished electronic thin film circuit. Solder layer 6 greatly increases the electrical conductivity of the conductive strips and the connecting terminals.

Figure 3:
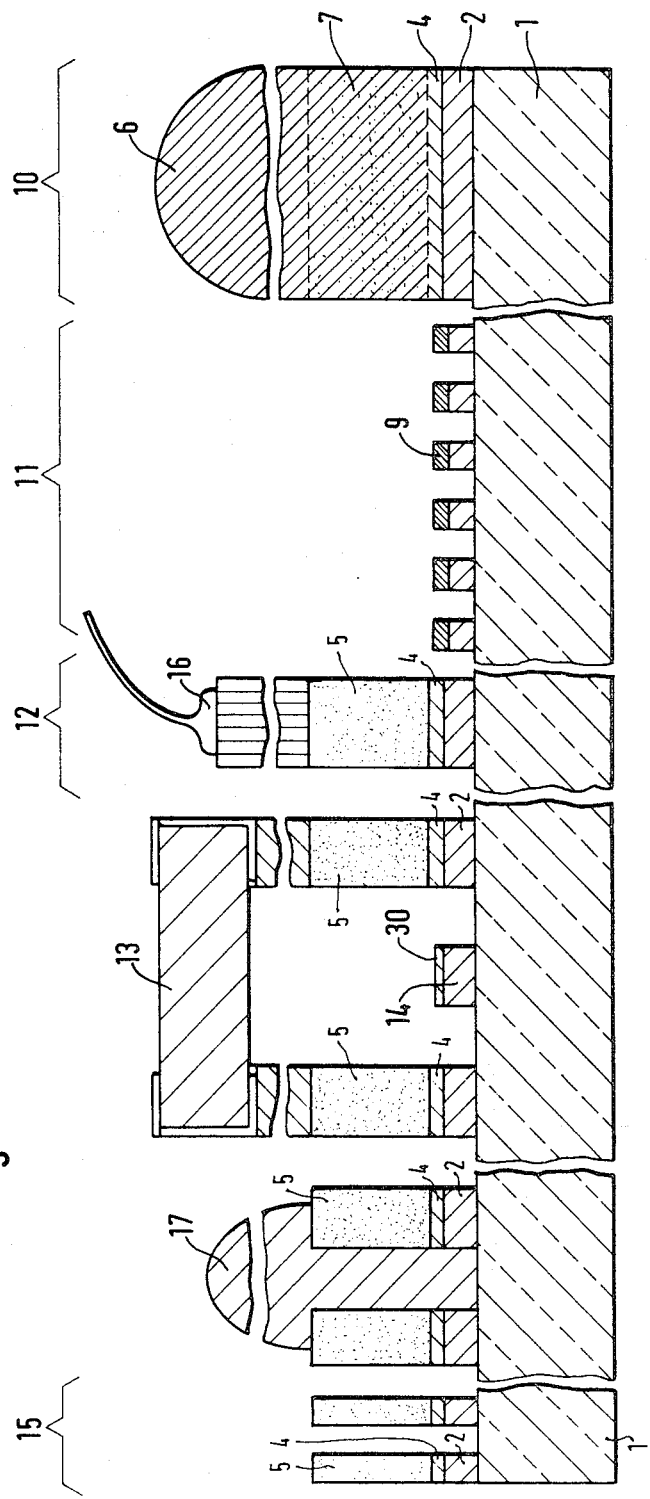
FIG. 3 shows a hybrid thin film circuit illustrating an application of an electronic thin film circuit according to the present invention.
Figure 4D:
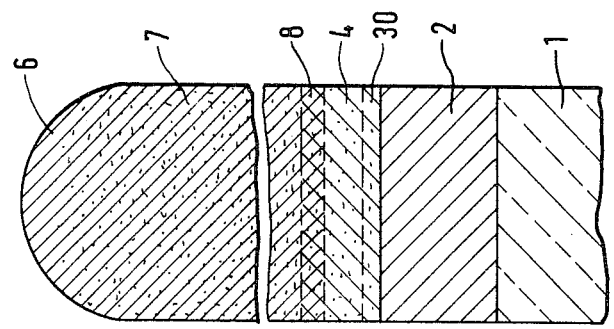
Figure 4C:
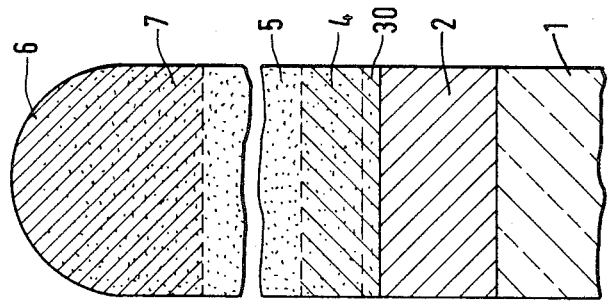
Figure 4B:
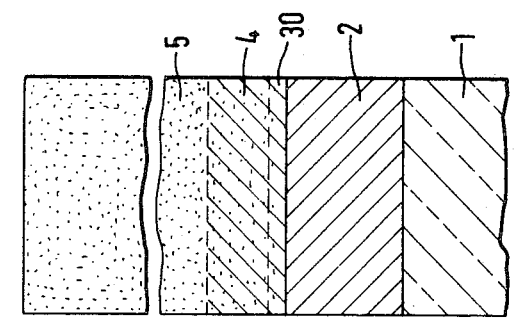
Figure 4A:
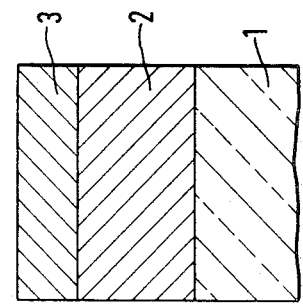

An application of the electronic thin film circuit according to the invention is shown as the thin film hybrid illustrated in FIG. 3. The substrate is again affixed with reference numeral 1, the tantalum layer with reference numeral 2. An oxide layer formed by anodic oxidation on trimmed tantalum resistor 11 is given reference numeral 9. Reference numeral 10 refers to a conductive region covered by a lead-tin soft solder layer. A galvanically amplified conductive portion 12 has a bonder contact 16. A circuit component 13 has been soldered to the device in a reflux process. An untrimmed tantalum resistor 14 has a protective layer 30. Reference numeral 15 denotes a temperature dependent resistor (sensor), while reference numeral 17 denotes a printed CP resistor (conductive plastic resistor). In FIGS. 4*a* to 4*d*, the creation of boundary layer 4 and its functioning as a blocking layer for the solder are schematically illustrated. FIG. 4*a* shows the device after forming of the tantalum oxide layer 3. FIG. 4*b* shows the same device after the deposition of nickel layer 5. One can see how the boundary layer 4 was formed from oxide layer 3. Reference numeral 30 denotes that part of boundary layer 4 which does not dissolve in the selective nickel etching medium and which serves as a protective layer for the untrimmed tantalum resistor (compare with position 14 in FIG. 3). FIGS. 4*c* and 4*d* show the same device as shown in FIG. 4*b*, but after application of the lead-tin soft solder layer 6. FIG. 4*c* illustrates this system for short soldering times and/or low soldering temperatures, FIG. 4*d* for long soldering times and/or high soldering temperatures. In FIG. 4*c*, only a small part of nickel layer 5 has dissolved in solder layer 6, while in FIG. 4*d* the whole nickel layer 5 has been so dissolved. Further, also as shown in FIG. 4*d*, a portion 8 of boundary layer 4 has been dissolved in the solder. In both FIGS. 4*c* and 4*d*, the portion of nickel layer 5 dissovled in solder 6 is denoted by reference numeral 7.

Various changes and modifications may be made within the scope of the inventive concepts.

We claim:

1. In an electronic thin film circuit comprising a substrate (1) of insulating material, a valve metal layer (2) covering a part of said substrate and forming a first ($M_1$) and at least one further ($M_2$, $M_3$) pattern, said first pattern constituting electrically conductive connecting means, said second pattern constituting an electronic circuit element, and a nickel layer (5) positioned over said valve metal layer in said first pattern, and a soft solder layer (6) covering at least a part of said nickel layer (5) the improvement comprising a boundary layer (4) comprising said valve metal, an oxide of said valve metal, nickel, nickel oxide and mixed phases thereof integral with and between said valve metal layer and said nickel layer, said boundary layer having been formed by forming an oxide layer having a thickness between 3 and 10 nm on said valve metal, applying said nickel layer and applying sufficient energy to form said boundary layer of valve metal, valve metal oxide, nickel oxide, nickel and mixed phases thereof by diffusion either during or subsequent to applying said nickel layer.

2. An electronic thin film circuit as set forth in claim 1, wherein said oxide layer on said valve metal is formed having a thickness of 5 nm.

3. An electronic thin film circuit as set forth in claim 2, wherein said valve metal layer is tantalum.

4. An electronic thin film circuit as set forth in claim 1 or 2, wherein said metallic soft solder layer is deposited by immersion in lead-tin solder.

5. An electronic thin film circuit as set forth in claim 1, wherein said further pattern of said valve metal layer constitutes a resistor having a resistance substantially independent of temperature changes.

6. An electronic thin film circuit as set forth in claim 1, wherein said further pattern (M3) defines at least one temperature dependent resistor; and
wherein said boundary layer is arranged on said valve metal layer and said nickel layer is arranged on said boundary layer in the region of said further pattern, said nickel layer constituting said temperature dependent resistance in said region of said further pattern.

7. An electronic thin film circuit as set forth in claim 1, wherein the square resistance of said valve metal layer is between 20 and 200 ohms.

8. An electronic thin film circuit as set forth in claim 7, wherein said square resistance of said valve metal layer is approximately 50 ohms.

9. An electronic thin film circuit as set forth in claim 1, wherein the square resistance of said nickel layer is between 0.1 and 5 ohms.

10. An electronic thin film circuit as set forth in claim 9, wherein said square resistance of said nickel layer is 0.5 ohms.

11. An electronic thin film circuit as set forth in claim 1, wherein said boundary layer is created on said valve metal layer by
oxidizing said valve metal layer, thereby forming a valve metal oxide layer; and
depositing a nickel layer on said valve metal oxide layer with sufficient energy to cause intermetallic diffusion of nickel atoms into said valve metal oxide layer.

12. A method for manufacturing an electronic thin film circuit on an insulating substrate (1), comprising the steps of depositing a valve metal layer (2) on said substrate by cathode sputtering;
oxidizing said valve metal layer, thereby creating a valve metal oxide layer having a thickness between 3 and 10 nm on said valve metal;
applying a nickel layer to said valve metal oxide layer by cathode sputtering, at a sputtering energy sufficiently high to cause an intermetallic diffusion of nickel atoms into said valve metal oxide layer to form a boundary layer (4) comprising said valve metal, an oxide of said valve metal, nickel, nickel oxide and mixed phases thereof, whereby a three-layer system is created on said substrate; and
etching said three-layer system to create predetermined patterns constituting circuit elements of said thin film circuit.

13. A method as set forth in claim 12 wherein said thickness of said valve metal oxide layer is 5 nm.

14. A method as set forth in claim 12, wherein said step of etching said three-layer system comprises applying a photoresist mask (90) to all parts of said nickel layer at which the surface of said substrate is not to be re-exposed, etching said nickel layer and most of said boundary layer in the region uncovered by said photoresist mask in a nickel etching substance comprising a mixture of 190 g/l $(NH_4)_2S_2O_8$ and 460 g/l $H_2SO_4$, and etching the remainder of said boundary layer still on said valve metal layer and said valve metal layer in a valve metal etching solution comprising a mixture of 190 g/l $(NH_2)_2S_2O_8$ and 125 g/l HF whereby a plurality of patterns forming the basic geometry of said electronic thin film circuit has been created.

15. A method as set forth in claim 14, wherein said plurality of patterns comprises a pattern constituting a temperature independent resistor;
further comprising the step of selectively removing said nickel layer and said boundary layer except for a non-soluble portion (30) from said valve metal layer in the region of said pattern by etching with a mixture of 190 g/l $(NH_4)_2S_2O_8$ and 460 g/l $H_2SO_4$.

16. A method as set forth in claim 15, wherein said step of selectively etching said nickel layer and most of said boundary layer from said valve metal layer in the region of said pattern constituting said temperature independent resistor comprises the step of removing said photoresist mask (90) by a second exposure and developing in the region of said pattern.

17. A method as set forth in claim 16, wherein said selective etching of said nickel layer and most of said boundary layer creates a remaining boundary layer in the region of said temperature indpendent resistance pattern;
further comprising the steps of dissolving said remaining boundary layer in an electrolyte in the presence of current flow thereby creating an exposed valve metal layer surface, and subsequently forming a valve metal oxide layer (9) on said exposed surface of said valve metal layer by anodic oxidation.

18. A method as set forth in claim 17, wherein said anodic oxidation is carried out with an electrolyte comprising $Na_2SO_4$ and/or $NH_4Cl$, and wherein a constant voltage between 1 and 10 volts is applied to said temperature independent resistor for such a time interval that said remaining boundary layer is fully dissolved in said electrolyte.

19. A method as set forth in claim 12, wherein said plurality of patterns comprises a pattern constituting electrically conductive connecting means;
further comprising the step of depositing a metallic reinforcement layer on at least parts of said nickel layer in the region of said pattern constituting said electrically conductive connecting means.

20. A method as set forth in claim 19, wherein depositing said metallic reinforcement layer comprises electroplating said metallic reinforcement layer onto said nickel layer.

21. A method as set forth in claim 19, wherein said metallic reinforcement layer is a soft solder layer (6); and
wherein said soft solder layer is deposited by immersion of said substrate with said three-layer system in liquid soft solder.

22. A method as set forth in claim 12, wherein said plurality of patterns comprises a pattern constituting a temperature-dependent resistor.
further comprising the step of printing a conductive-plastic resistor (17) on parts of said nickel layer in the region of said pattern constituting said temperature-dependent resistor and on exposed portions of said substrate.

* * * * *